United States Patent [19]
Wisser

[11] 3,721,941
[45] March 20, 1973

[54] MULTIPLE SOCKET CONNECTOR APPARATUS

[75] Inventor: William L. Wisser, Ambler, Pa.

[73] Assignee: Narco Scientific Industries, Inc., Fort Washington, Pa.

[22] Filed: Nov. 3, 1971

[21] Appl. No.: 195,208

[52] U.S. Cl......339/17 CF, 174/DIG. 3, 317/101 CP, 339/17 L, 339/19, 339/126 R, 339/192 R

[51] Int. Cl.................................................H05k 1/02

[58] Field of Search.........174/DIG. 3; 317/101 CP, 174/101 DH; 339/17 R, 17 C, 17 CF, 17 L, 18 R, 19, 36, 66, 75, 119, 125, 126, 176, 192, 276, 206

[56] References Cited

UNITED STATES PATENTS

| | | | |
|---|---|---|---|
| 3,467,944 | 9/1969 | Hammell et al. | 339/192 R X |
| 3,448,345 | 6/1969 | Koehler, Jr. et al. | 339/17 CF X |
| 3,622,950 | 11/1971 | Millinger | 339/174 |
| 3,649,950 | 3/1972 | Gluntz | 339/17 CF |
| 3,605,062 | 9/1971 | Tinkelenburg et al. | 339/17 CF |
| 3,368,117 | 2/1968 | Pond et al. | 317/101 DH |
| 3,629,803 | 12/1971 | Gluntz | 339/107 R |

*Primary Examiner*—Marvin A. Champion
*Assistant Examiner*—Terrell P. Lewis
*Attorney*—Henry N. Paul, Jr. et al.

[57] ABSTRACT

A multiple socket connector, for integrally connecting multiple points on a printed circuit board through a chassis to a system harness. An integrated circuit is connected to a wire wrap type printed circuit socket, the pins of which connect to and extend through the printed circuit board, and which also extend through a chassis opening and connect to a mating dual-in-line IC socket. The output leads of the IC socket are connected to the system harness. A spacer may be provided between the two sockets to insulate the wire wrap leads from the chassis.

3 Claims, 2 Drawing Figures

INVENTOR.
William L. Wisser
BY
Paul & Paul
ATTORNEYS.

MULTIPLE SOCKET CONNECTOR APPARATUS

BACKGROUND OF THE INVENTION

A. Field of the Invention

This invention relates to connectors for coupling multiple points on a printed circuit board to a system harness, and particularly to a connector connecting multiple points on a printed circuit board to a system harness through an opening in the chassis which supports the printed circuit board.

B. Description of the Prior Art

With the advent of integrated circuits and other miniaturized components in the electronics art, the problem of providing reliable and efficient connections has assumed great importance. As is known in the art, a given integrated circuit has a relatively great number of terminal leads, typically 14 or 16, which leads are confined to a relatively small physical space. Where a number of such integrated circuits are mounted on a given printed circuit board, it is necessary to connect all such multiple terminal leads of each integrated circuit to points on the printed circuit board. Where it is also desired to couple all such points to a system harness located on another side of the system chassis, it is appreciated that the connections must be as efficient as possible. Ordinary socket connectors are unsuitable for such connections, as they do not provide pins of sufficient length to obtain a rigid and stable connection from the printed circuit through the chassis and to the system harness. Accordingly, there is a great need in the art for a means of obtaining an efficient, reliable and rigid connection from an integrated circuit to and through a printed circuit and through a chassis, and which can be easily and efficiently installed without the need of a skilled operator.

SUMMARY OF THE INVENTION

It is the purpose of this invention to provide a reliable connection from a plurality of integrated circuit terminal leads to multiple points on a printed circuit board, and therefrom through a chassis to a system harness.

In accordance with the above objective, there is provided a multiple socket connector unit comprising preferably a wire wrap type printed circuit socket adapted to receive the terminal leads of an integrated circuit, the wire wrap leads being placed in connection with and through a printed circuit and also extending through an opening in the chassis on which the printed circuit is mounted. The ends of the wire wrap leads are received in receiving openings of a dual-in-line integrated circuit socket, the terminal leads of which are connected to the system harness. A protective cap is provided which is adapted to be mounted over the terminal leads of the dual-in-line IC socket, to enable efficient registration of the dual-in-line socket with the wire wrap leads.

DESCRIPTION OF THE PREFERRED EMBODIMENT

Figures 1, 2:
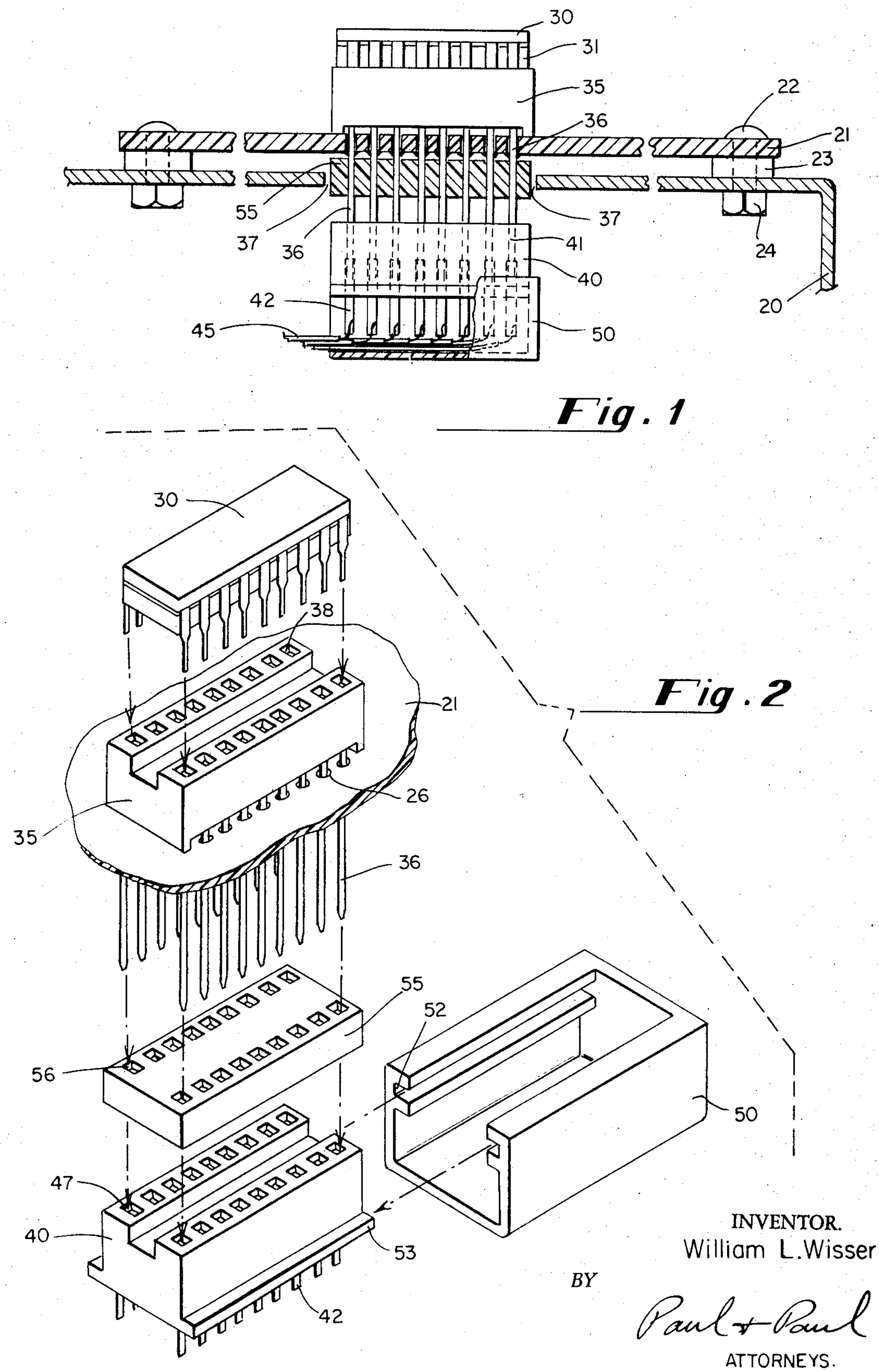
FIG. 1 is a cross sectional view showing the component parts of the connector unit of this invention in relation to a chassis and a printed circuit board mounted thereon.
FIG. 2 is a perspective view showing the inter-relationship of the component parts of the connector unit of this invention.

Referring now to FIG. 1, there is shown in cross-section a portion of a chassis 20 on which is mounted a printed circuit board 21. The mounting may be accomplished as shown by a screw 22 and nut 24, with a washer or other spacer 23 placed in between the chassis and the printed circuit board. A conventional integrated circuit (IC) 30 has terminal leads 31 connected thereto, normally 14 or 16 in number. It is desired to connect these leads both to the printed circuit board, and to the system harness identified by connecting leads 45 on the other side of the chassis 20. The terminal leads 31 are received in openings 38 of wire wrap type printed circuit (PC) socket 35. Socket 35 has, corresponding to openings 38, wire wrap leads 36, which are electrically connected to respective terminal leads 31 when IC 30 is inserted into socket 35. Leads 36 are inserted into and through openings in the PC board, and connected to the board at such point. This connection may be made by any suitable soldering process. The wire wrap leads 36 have sufficient length to extend through an opening 37 in chassis 20, where they are received in a dual-in-line IC socket 40. Socket 40 is mated to socket 35, and has receiving openings 41 which complement and register with the wire wrap leads 36. The openings 41 preferably have entry ways 47 which are enlarged in such a manner as to facilitate insertion of the wire wrap leads. The contacts within the socket are recessed within openings 41, and connect to respective IC terminals 42.

By means of the above, each of the IC terminal leads 31 is ultimately connected through to a respective IC socket terminal 42, each of which is in turn connected to a connecting lead 45 of the system harness. The length of the wire wrap leads 36 is sufficient to make the connection through the chassis 20, and in addition, the use of the mating socket 40 provides the necessary rigidity to the connection below the chassis.

It is generally desirable to insulate the wire wrap leads from the chassis by the use of an insulator-spacer 55. Spacer 55 has mating openings 56 through which the wire wrap leads 36 pass. Spacer 55 is constructed of a suitable insulator, so that each and all of the wire wrap leads are insulated from chassis 20.

In fabrication of an electronic package utilizing the apparatus of this invention, a number of integrated circuits 30 will have to be positioned in the circuit. Each IC 30 is connected to a wire wrap socket 35, which is then positioned through printed circuit board 21. Spacer 55 is then positioned onto the leads 36 from the open end, and positioned in registration with chassis 20. Dual-in-line circuit 40 is then connected to the ends of wire wrap leads 36, and connecting leads 45 are connected to socket terminal leads 46 by any suitable method.

To provide as rigid and reliable a connection as possible, it is necessary to apply force on socket 40 in such a direction as to have it completely and squarely engage wire wrap leads 36. In so doing, it is normally necessary for a worker to press, with his thumb or other finger, against the ends of terminal leads 42, which ends of course do not provide either a good or pleasing reaction surface. Consequently, in normal practice many of these connections are sloppily made, in order to avoid the physical pain of securing them tightly. In order to overcome this difficulty, a cap 50 is provided which encompasses the ends of leads 42. In order to secure efficient registration of the cap 50 over the socket 40, socket 40 may be constructed with a projecting ridge as shown at 53, and cap 50 with a complementary receiving groove 52. Alternately, cap 50 may be made of a resilient material which inherently cups over and attaches to the body of socket 40. By means of such cap, the worker fabricating the entire connector unit can easily secure all component parts of the entire connector unit by exerting force from each end. Further, the cap 50 and the socket 40 may be easily removed together, when it is necessary to disconnect the harness from the chassis.

I claim:

1. Connector apparatus for connecting multiple points on a printed circuit board mounted on a chassis through an opening in such chassis to a system harness, comprising:

a. a wire wrap type printed circuit socket, adapted to receive the terminal leads of an integrated circuit, and having wire wrap leads adapted to be connected to and extending through openings in said printed circuit;

b. a dual-in-line integrated circuit socket having receiving openings complementary to said wire wrap leads, and receiving same;

c. said integrated circuit socket being positioned on the opposite side of said chassis from said printed circuit board, and having socket terminal leads adapted to be connected to connecting leads of said system harness.

2. The apparatus as described in claim 1 comprising a spacer constructed of insulating material, having openings adapted for receiving said wire wrap leads, with said wire wrap leads inserted through said spacer openings, said spacer being positioned in registry with said chassis opening to insulate said wire wrap leads therefrom.

3. The apparatus as described in claim 2, comprising cap means for capping the terminal leads of said integrated circuit socket, whereby said connector unit may be efficiently and reliably fabricated.

* * * * *